United States Patent
Nicholls et al.

(10) Patent No.: US 7,181,243 B1
(45) Date of Patent: Feb. 20, 2007

(54) FREQUENCY TRANSLATION

(75) Inventors: Charles Nicholls, Nepean (CA); Steve Beaudin, Nepean (CA); Daniel Badiere, Ottawa (CA); Adrian J. Bergsma, Kanata (CA); Mark N. Willetts, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 413 days.

(21) Appl. No.: 10/910,840

(22) Filed: Aug. 4, 2004

Related U.S. Application Data

(60) Provisional application No. 60/579,869, filed on Jun. 15, 2004.

(51) Int. Cl.
*H04M 1/00* (2006.01)
*H04B 7/00* (2006.01)

(52) U.S. Cl. ............... 455/561; 455/562.1; 455/575.7; 455/276.1; 455/193.1

(58) Field of Classification Search ........ 455/121–124, 455/129, 193.1, 272–227.1, 562.1, 575.7
See application file for complete search history.

(56) References Cited

U.S. PATENT DOCUMENTS

| | | | | |
|---|---|---|---|---|
| 6,148,219 A | * | 11/2000 | Engelbrecht et al. | 455/456.2 |
| 6,266,545 B1 | * | 7/2001 | Backman et al. | 455/572 |
| 6,462,704 B2 | * | 10/2002 | Rexberg et al. | 342/174 |
| 6,594,508 B1 | * | 7/2003 | Ketonen | 455/561 |
| 6,801,788 B1 | * | 10/2004 | Csapo et al. | 455/561 |
| 6,983,174 B2 | * | 1/2006 | Hoppenstein et al. | 455/562.1 |
| 7,038,621 B2 | * | 5/2006 | Gabriel et al. | 342/372 |
| 7,123,939 B1 | * | 10/2006 | Bird et al. | 455/561 |
| 2001/0044323 A1 | * | 11/2001 | Waylett | 455/561 |
| 2002/0132644 A1 | * | 9/2002 | Mellor et al. | 455/562 |
| 2006/0003808 A1 | * | 1/2006 | Haskell et al. | 455/562.1 |

OTHER PUBLICATIONS

"Applications of PIN Diodes," Application Note 922, Agilent Technologies, pp. 12-14.
Jaffe, J. S. and Mackey, R. C., "Microwave Frequency Translator," IEEE Transactions on Microwave Theory and Techniques, May 1965, pp. 371-372.

* cited by examiner

*Primary Examiner*—Simon Nguyen
(74) *Attorney, Agent, or Firm*—Withrow & Terranova, PLLC

(57) ABSTRACT

The present invention provides a serrodyne architecture that is capable of operating at high frequencies. The architecture generally includes a coupler, a delay line, and a switching system. The delay line is coupled to a reflective port of the coupler. The switching system is coupled to the delay line at different points and is configured to selectively shunt those points on the delay line to change the effective electrical length of the delay line. The effective electrical length is changed throughout the period, corresponding to the amount the frequency of the input signal is shifted. In operation, an input signal is provided to an input port of the coupler, and an output signal is provided at the output port, wherein the input signal and the output signal vary by a translation frequency, which is controlled based on how the effective electrical length of the delay line is changed.

36 Claims, 9 Drawing Sheets

DOWNCONVERSION

| | SWITCHING ELEMENT | | |
|---|---|---|---|
| | 6A | 6B | 6C |
| 1 | 1 | 1 | 1 |
| 2 | 0 | 1 | 1 |
| 3 | 0 | 0 | 1 |
| 4 | 0 | 0 | 0 |
| 1→4 | 1 | 0→1 | 0→1 |

FIG. 1B

UPCONVERSION

| | SWITCHING ELEMENT | | |
|---|---|---|---|
| | 6A | 6B | 6C |
| 1 | 0 | 0 | 0 |
| 2 | 0 | 0 | 1 |
| 3 | 0 | 1 | 1 |
| 4 | 1 | 1 | 1 |
| 1→4 | 1 | 1→0 | 1→0 |

FIG. 1C

FREQUENCY TRANSLATION

This application claims the benefit of U.S. provisional application Ser. No. 60/579,869 filed Jun. 15, 2004, the disclosure of which is hereby incorporated by reference in its entirety.

CROSS-REFERENCE TO RELATED APPLICATIONS

The present invention is related to co-assigned U.S. patent application Ser. No. 10/811,164 filed Mar. 26, 2004 entitled FEEDER CABLE REDUCTION, the disclosure of which is incorporated herein by reference in its entirety.

FIELD OF THE INVENTION

The present invention relates to radio frequency communications, and in particular to translating signals received at one frequency to being centered about another frequency.

BACKGROUND OF THE INVENTION

In many communication technologies, there is a need to shift signals from one frequency to another. Such frequency translation often employs various types of mixers. Unfortunately, the inherent nature of mixing results in signals with a double sideband, which requires additional filtering or wastes available channel space in the allocated frequency spectrum. Further, the mixers often suffer from poor linearity and inject a loss in the signal path, which must often be compensated for with additional amplification. Compensating for linearity and loss shortcomings often results in additional complexity of the circuitry required for frequency translation.

An alternative to mixers has been serrodyne structures, which result in a pure frequency shift wherein the resultant signal has a single sideband. Unfortunately, traditional serrodyne architectures are based on ferrite-based phase shift elements and are not capable of operation at high frequencies due to limitation in switching speeds. In particular, the switching speeds for modern mobile communications is in the hundreds or thousands of Megahertz, which results in pulse transition times in the serrodyne that fall within the sub-nanosecond realm. Magnetically actuated devices simply cannot switch at these speeds. Accordingly, serrodyne architectures based on traditional magnetic architectures cannot operate at the required modulation frequencies for many wireless communication technologies. Thus, there is a need for a frequency translation architecture that relates in a single sideband output signal, and that can operate within a frequency range sufficient for modern wireless communication techniques.

SUMMARY OF THE INVENTION

The present invention provides a serrodyne architecture that is capable of operating at high frequencies. The architecture generally includes a coupler, a delay line, and a switching system. The delay line is coupled to a reflective port of the coupler, which may take the form of a circulator, hybrid coupler, or the like. The switching system is coupled to the delay line at different points and is configured to selectively shunt those points on the delay line to change the effective electrical length of the delay line. The effective electrical length is changed throughout the period, corresponding to the amount the frequency of the input signal is shifted. In operation, an input signal is provided to an input port of the coupler, and an output signal is provided at the output port, wherein the input signal and the output signal vary by a translation frequency, which is controlled based on how the effective electrical length of the delay line is changed.

If the effective electrical length is increased throughout the period corresponding to the translation frequency, the output signal is effectively downconverted and will be of a frequency less than the input signal. If the effective electrical length is decreased throughout the period corresponding to the translation frequency, the output signal will have a frequency greater than the frequency of the input signal. The amount of shift is equal to the translation frequency.

The switching system may take many forms, and may be created from discrete components or may be integrated within an integrated circuit. During operation, switching elements, such as transistors, within the switching system are controlled such that the simultaneous switching of multiple switching elements is not required in an effort to minimize complexity as well as avoid irregularities caused by the inability of multiple switching elements to switch in perfect unison.

The frequency translation architecture of the present invention is particularly applicable to a system in which the cabling requirements are reduced between a base station and a corresponding masthead, which supports the antennas associated with the base station. In this system, signals received from one or more main and diversity antennas are translated from one frequency to another, combined with signals from other antennas, and sent over a common cable between the base station and the masthead electronics. After being combined and delivered over a single cable, the signals can be separated and translated back to their original frequencies, as necessary, and processed accordingly. Those skilled in the art will recognize various other applications of the present invention.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIGS. 1B and 1C are state diagrams for upconverting and downconverting frequencies according to the embodiment of FIG. 1A.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Turning now to FIG. 1, a block representation of serrodyne-based frequency translation circuitry is illustrated according to a first embodiment of the present invention. In general, the frequency translation afforded by the present invention provides for single sideband frequency translation to essentially provide Doppler shifting of a radio frequency input ($RF_{IN}$) at a first frequency, $f_{RF}$, to a translated radio frequency ($RF_{OUT}$) at a frequency of $f_{RF} \pm f_{SHIFT}$, wherein $f_{SHIFT}$ represents the amount $RF_{IN}$ is being translated in frequency. The single sideband frequency translation minimizes waste of the available frequency spectrum.

As illustrated, a multi-port frequency coupler 2, such as a circulator, is associated with a delay line 4 having a defined electrical length. The delay line 4 is divided into a number of sections, and in the present example is divided into three sections, wherein nodes defining the boundaries of each section are selectively coupled to ground through a corresponding switching element 6 (A–C). The switching element 6 may take the form of any high-speed switching device, such as a field effect transistor (FET) or bipolar transistor. The switching elements 6 are controlled by control circuitry 8 in a manner that will be described in further detail below.

Figure 1A:
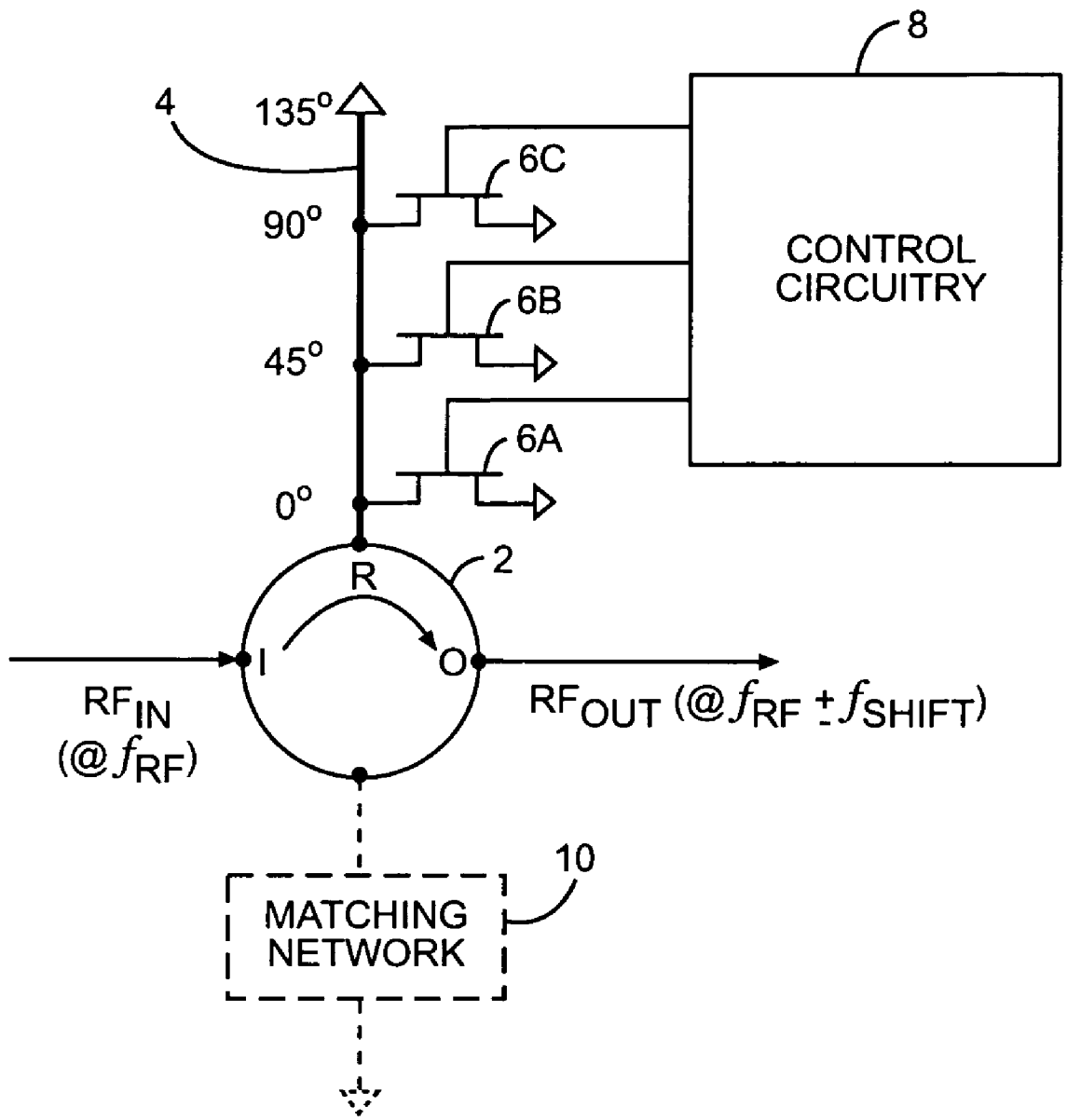
FIG. 1A is a block representation of a frequency translation architecture according to one embodiment of the present invention.

The coupler 2 as illustrated in FIG. 1A includes at least three ports: an input port (I), a reflection port (R), and an output port (O). The input port I receives the signal $RF_{IN}$ to be translated and the output port O provides the translated signal $RF_{OUT}$. The delay line 4 is coupled between the reflection port R and electrical ground. The switching elements 6 are coupled between their respective nodes on the delay line 4 and ground, and when active, will short the corresponding node on the delay line 4 to ground. As such, the effective electrical length of the delay line 4 will change depending on which switching elements 6 are active and shunting their corresponding nodes on the delay line 4 to ground. In essence, the control circuitry 8 controls the switching elements 6 to provide an electronically controlled short circuit having a controllable electrical length at the reflection port R of the coupler 2. In the present embodiment, the delay line 4 has an electrical length of 135 degrees and the three illustrated nodes represent 0, 45, and 90 degrees in electrical length. In one embodiment, the switching elements 6 are sufficiently proximate to their corresponding nodes on the delay line 4 to have minimal impact on the effective electrical length.

Depending on how the switching elements 6 are controlled, the signal $RF_{IN}$ can be translated to a higher or lower frequency. In general, a translation to a higher frequency is referred to as upconversion, and a translation to a lower frequency is referred to as downconversion. In operation, the energy associated with the input signal $RF_{IN}$ is radiated out of the reflection port R along the delay line 4, reflected back into the reflection port R, and provided to the output port O. Preferably, the input signal $RF_{IN}$ is isolated from the reflected signal, which represents the translated signal $RF_{OUT}$. The translation of the input signal $RF_{IN}$ is controlled by the sequential changing of the effective electrical length of the delay line 4. If the switching elements 6 are configured to operate to effectively increase the electrical length, the increasing electrical length effectively increases the wavelength, and thus decreases the frequency of the signal. If the electrical length of the delay line 4 is decreased, the wavelength is compressed and the frequency is increased. The amount of the frequency shift is a function of the cycle associated with the changing electrical length provided at the reflection port (R).

With reference to FIG. 1B, an example is provided wherein $RF_{IN}$ is translated from a frequency $f_{RF}$ to a frequency of $f_{RF} - f_{SHIFT}$. The state table of FIG. 1B corresponds to how each of the switching elements 6A–6C is controlled throughout a period corresponding to $f_{SHIFT}$ ($1/f_{SHIFT}$). Further, a logic 1 indicates that the switching element 6 is active, and the corresponding node on the delay line 4 is coupled to ground. A logic 0 indicates that the switching element 6 is open. Initially assume that all of the switching elements 6A–6C are active. At this point, the delay line 4 is shunted to ground at the 0° node, and any instant radiation exiting the reflection port R is reflected back to the reflection port R from the 0° node. For the second state in the period, assume the control circuitry 8 operates to deactivate switching element 6A while switching elements 6B and 6C remain active. At this point, the instant radiation reflected out of the reflection port R is reflected from the 45° node, and thus the effective electrical length is increased. For state three, switching element 6B is deactivated, and the instant radiation is reflected from the 90° node, thus further extending the electrical length associated with the reflection port R. For the final state, all of the switching elements 6 are deactivated, and the instant radiation from the reflection port R is reflected from the point at which the delay line 4 is grounded (the 135° node). The systematic increase of the electrical length associated with the reflection port R effectively decreases the frequency of the input signal $RF_{IN}$ and results in the signal $RF_{OUT}$ being provided at the output port O at a frequency equal to $f_{RF} - f_{SHIFT}$. Notably, the switching of the switching elements 6 is continuously repeated from one period to the next.

In one embodiment, transition from state four back to the initial state one is controlled by initially activating switching element 6A, such that the switching of switching elements 6B and 6C to an active state has no effect on the provided electrical length, since the 0° node is shunted to ground. By the time the transition to state two is required, switching elements 6A–6C are all activated. Thus, for high-frequency operation, any difficulties normally associated with simultaneously switching transistors or other like switching elements are avoided.

With reference to FIG. 1C, an upconversion process is described. For the upconversion process, the previously described downconversion process is effectively reversed. Initially, assume that switching elements 6A–6C are deactivated, such that the beginning of the period starts with the longest possible electrical length, and the electrical length decreases throughout the period. By decreasing the electrical length, the frequency of the input signal $RF_{IN}$ is increased. Again, the period associated with decreasing the electrical length associated with the delay line 4 directly corresponds to the amount by which the input signal $RF_{IN}$ is translated in frequency. When transitioning to state two, the control circuitry 8 will activate switching element 6C to shunt the 90° node to ground to reduce the effective electrical length associated with the reflection port R. For state three, switching element 6B is activated to shunt the 45° node of the delay line 4 to ground and further reduce the electrical length associated with the reflection port R. During the fourth state, the control circuitry 8 activates switching element 6A to shunt the 0° node of the delay line 4 to ground and further reduces the electrical length associated with the reflection port R. Thus, throughout the period (states 1–4), the electrical length for reflecting the instant radiation associated with the input signal $RF_{IN}$ is decreased, which results in an increase in the frequency associated with $RF_{OUT}$ by a frequency equal to $f_{SHIFT}$.

When transitioning back from state four to state one, the control circuitry 8 will deactivate switching elements 6B and 6C during state four, such that the actual transition to state one from state four will correspond to switching element 6A being deactivated. Since the 0° node is shunted to ground while switching elements 6B and 6C are deactivated, the deactivation of switching element 6B and 6C has no impact on the electrical length associated with the reflection port R. Again, simultaneous switching of multiple switching elements 6 is not required.

In an exemplary upconversion scenario, $RF_{IN}$ may have a carrier frequency of 1850 MHz, wherein communication channels are divided into a number of 1.2288 MHz bands. To upconvert the signal $R_{FIN}$ by 162 MHz to 2012 MHz ($R_{FOUT}$), $f_{SHIFT}$ equals 162 MHz. The period during which the four switching states occur is $\frac{1}{162}$ MHz or 6.17 nanoseconds. As such, each state is approximately 1.53 ns when $f_{SHIFT}$ equals 162 MHz.

The concepts of the present invention may be implemented in different ways. With reference back to FIG. 1A, the circulator embodiment of the coupler 2 may have a fourth port through which a matching network 10 is coupled to ground. The output port O and the port to which the matching network 10 is coupled are associated such that the matching network 10 corresponds to the output impedance and operates to improve isolation of the signal $RF_{OUT}$ from the signal $RF_{IN}$, as will be appreciated by those skilled in the art. Other potential embodiments include but are not limited to those illustrated in FIGS. 2 and 3.

Figure 2:
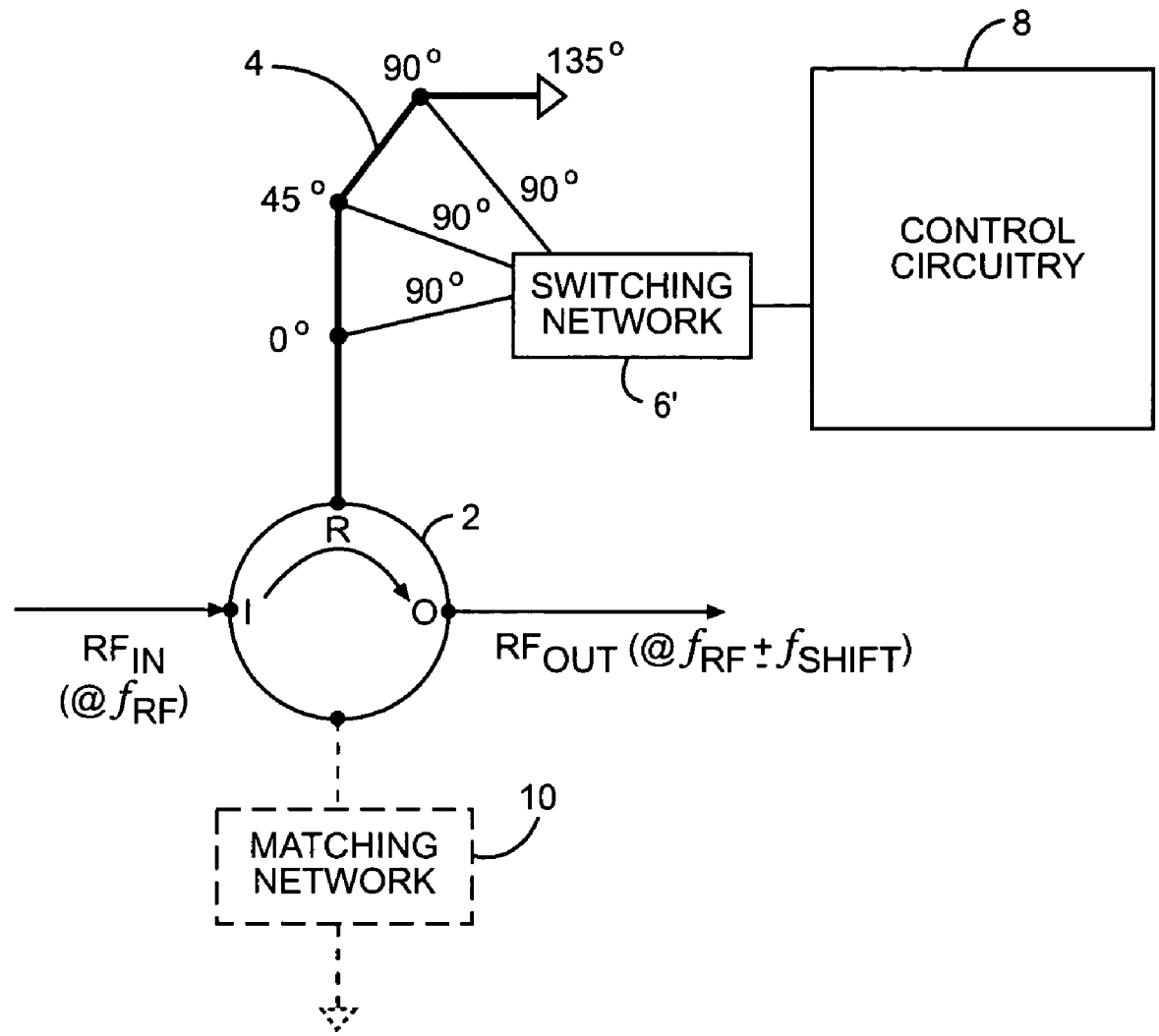
FIG. 2 is a block representation of a frequency translation architecture according a second embodiment of the present invention.

The embodiment of FIG. 2 uses a circulator as the coupler 2, yet varies the implementation of the delay line 4 in association with the switching elements 6A–6C. In this embodiment, a switching network 6' is connected at the 0°, 45°, and 90° nodes through ¼ wavelength connections. The quarter wave lines operate to transform the switch impedance from a short circuit at the switch node to an open circuit at the delay line node. Introduction of the quarter wave transformer enables the switching network 6' to be located at one physical location. As such, the effective electrical length is selectively increased or decreased throughout a given period by connecting select nodes to each other or to ground.

Those skilled in the art will recognize various techniques for sequentially lengthening or shortening the effective electrical length of the delay line 4 using various switching techniques, architectures, or implementations over the period corresponding to $f_{SHIFT}$. The embodiment of FIG. 2 is particularly beneficial when the invention is being implemented in an integrated fashion. A single physical location for the switching network enables use of a single integrated switch matrix for the switching network. Use of a single integrated circuit switch network reduces the manufacturing cost and improves product reliability over use of three separate switch circuits for example.

Figure 3:
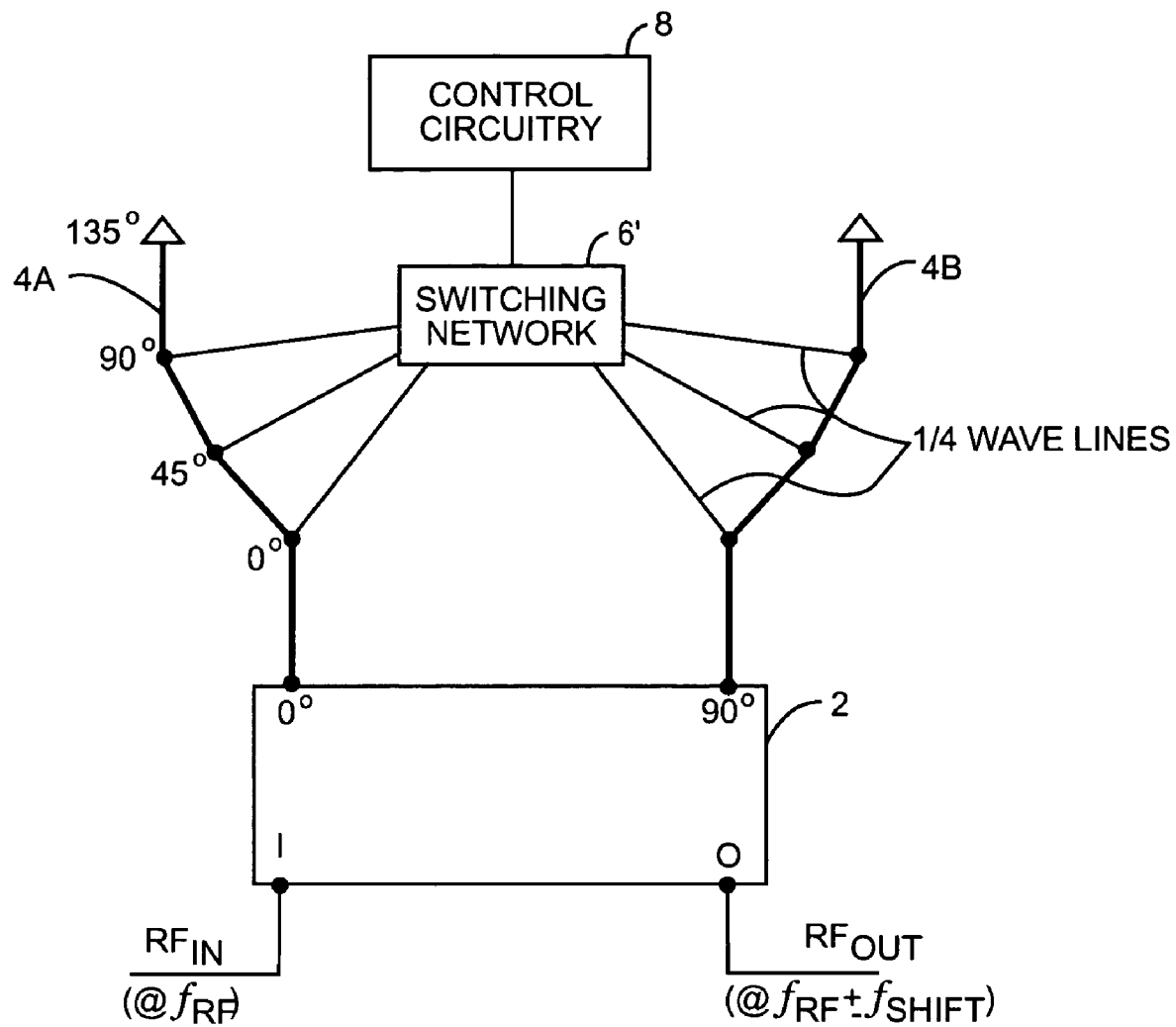
FIG. 3 is a block representation of a frequency translation architecture according a third embodiment of the present invention.

With reference to FIG. 3, the coupler 2 takes the form of a hybrid coupler, which effectively includes two reflective ports, referenced as 0° and 90° ports. Essentially, half of the radiated power associated with $RF_{IN}$ is reflected along delay lines 4A and 4B and the reflected waves are combined in-phase and provided to the output port O. Application of half the radiated power to each switch element improves the linearity of this implementation by 3 dB over those in which a single delay line is used. In operation, the reflections from port O are shifted by 90 degrees and those from port 90 are not shifted, such that the resultant reflections are in-phase with one another. In FIG. 3, quarter wave lines are used as in FIG. 2 to enable collocation of the switch network. The embodiment of the invention illustrated in FIG. 3 may not require the quarter wave lines in the event that the switch network consists of a series of discrete switch elements or in the event that the delay line is meandered so as to enable connection to the switching network without recourse to use of quarter wave lines.

The present invention may be implemented in a system to reduce cabling required in a base station environment. In the system, signals that were normally transmitted over separate cables are frequency shifted about different center frequencies, combined, and sent over a single cable. The frequency shifting may be provided by the previously described frequency translation architectures. At a receiving end of the cable, the combined signals are recovered and processed in traditional fashion. The system is particularly useful in a diversity environment, wherein multiple antennas are used to receive a common signal. In such an environment, certain of the signals received from the main and diversity antennas are shifted in frequency, combined with one another, and transmitted over a common cable. Accordingly, each sector, which includes a main and one or more diversity antennas, will need only one cable for transmitting the received signals from the antennas to electronics in a base housing.

Figure 4:
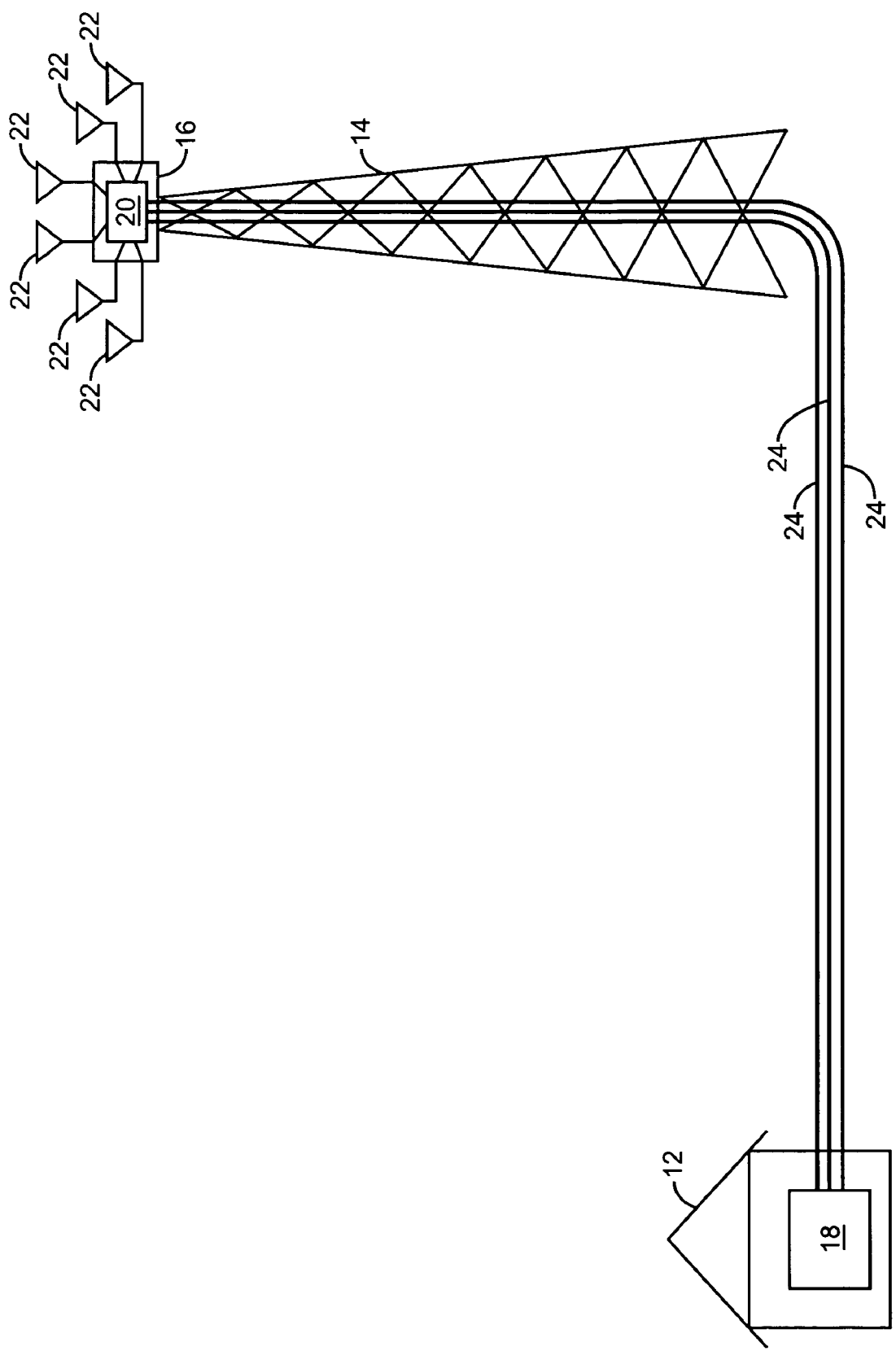
FIG. 4 is a block representation of a base station environment according to one embodiment of the present invention.

Prior to delving into the details of the system, an overview of a base station environment 10 is illustrated in FIG. 4 according to one embodiment. The illustrated base station environment is exemplary of the primary components in a cellular access network. A base housing 12 is provided in a secure location in association with a mast 14, which may be a tower or other structure near the top of which is mounted a masthead 16. Communications for the base station environment 10 are distributed between the masthead 16 and the base housing 12. In particular, the base housing 12 will include base housing electronics 18, which include the primary transceiver and power amplification circuitry required for cellular communications. The masthead 16 will include masthead electronics 20, which generally comprise the limited amount of electronics necessary to operatively connect with multiple antennas 22, which are mounted on the masthead 16. The masthead electronics 20 and the base housing electronics 18 are coupled together with one or more feeder cables 24. For the illustrated embodiment, there are six antennas 22 divided into three sectors having two antennas 22 each. For each sector, one feeder cable 24 is provided between the masthead electronics 20 and the base housing electronics 18. Accordingly, there are three feeder cables 24 illustrated in FIG. 4. In traditional base station environments, each antenna would be associated with one feeder cable 24.

Figure 5:
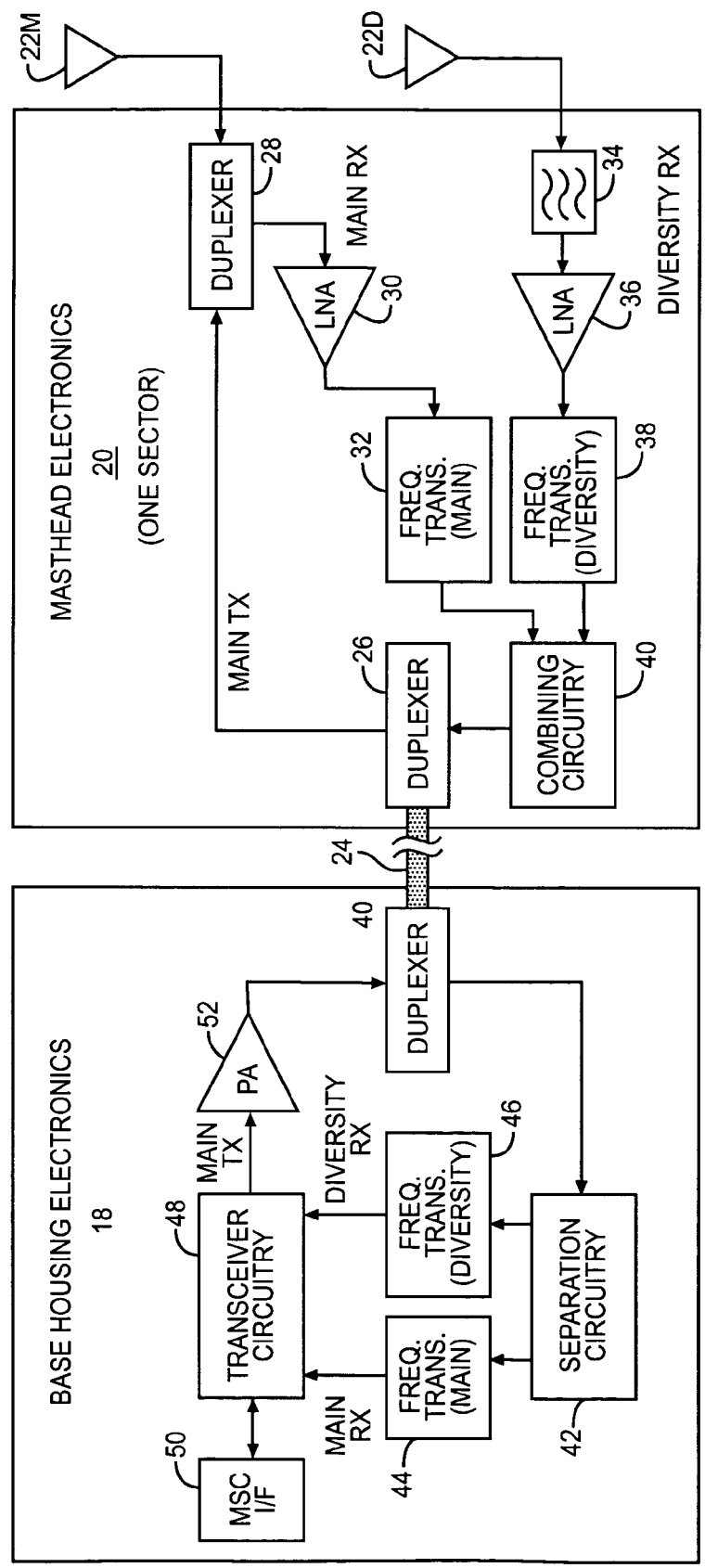
FIG. 5 is a block representation of base housing electronics and masthead electronics according to a first embodiment of a cabling reduction system.

Turning now to FIG. 5, a block representation of the base housing electronics 18 and one sector of the masthead electronics 20 is provided according to one embodiment of the cabling reduction system. Notably, there are two antennas 22 illustrated. A first antenna is referred to as a main antenna 22M, and the second antennas is referred to as a diversity antenna 22D. For signals transmitted from the main antenna 22M, a signal to be transmitted will be provided over the feeder cable 24 to a duplexer 26 in the masthead electronics 20. The signal to be transmitted (MAIN TX) is sent to another duplexer 28 and transmitted via the main antenna 22M.

For receiving, signals transmitted from remote devices will be received at both the main antenna 22M and the diversity antenna 22D. The signals received at the main antenna 22M are referred to as the main receive signals (MAIN RX), and the signals received at the diversity antenna 22D are referred to as the diversity receive signals (DIVERSITY RX). In operation, the main receive signal received at the main antenna 22M is routed by the duplexer 28 to a low noise amplifier (LNA) 30, which will amplify the main receive signal and present it to main frequency translation circuitry 32, such as that described above. The main frequency translation circuitry 32 will effect a frequency translation, which is essentially a shift of the main receive signal from being centered about a first center frequency to being centered around a second center frequency. The main frequency translation circuitry 32 may also take the form of a mixer or the like, instead of the serrodyne architectures described above. The mixer is capable of shifting the center frequency of the main receive signal.

Similarly, the diversity receive signal received at the diversity antenna 22D may be filtered via a filter 34 and amplified using an LNA 36 before being presented to diversity frequency translation circuitry 38. The diversity frequency translation circuitry 38 will effect a frequency translation of the diversity receive signal from being centered about the first center frequency to being centered about a third center frequency. Preferably, the first, second, and third center frequencies are sufficiently different as to allow signals being transmitted or received at those frequencies to be combined without interfering with one another.

Figure 6:
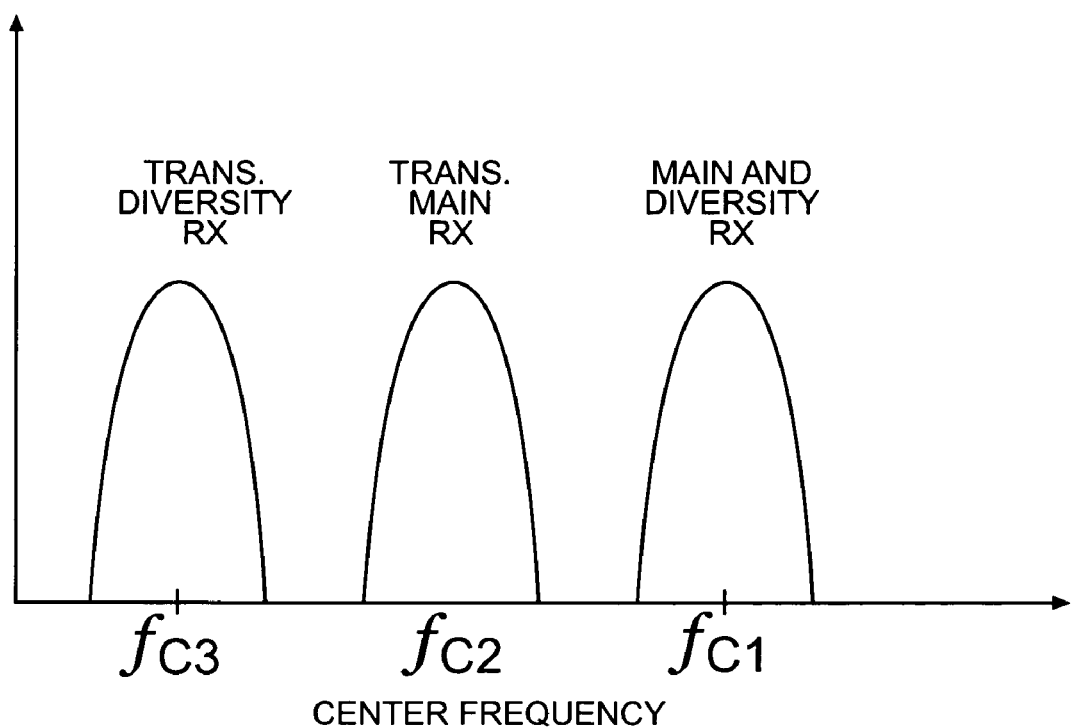
FIG. 6 is a graphical illustration of a frequency translation process according to the embodiment of FIG. 5.

With reference to FIG. 6, a graphical illustration of the frequency translation process is provided. As illustrated, the main and diversity receive signals are centered about the first center frequency $f_{C1}$, wherein the translated main receive signal is centered about center frequency $f_{C2}$ and the translated diversity receive signal is centered about center frequency $f_{C3}$. The center frequencies are sufficiently spaced along the frequency continuum to avoid any interference between the signals transmitted on those center frequencies.

Returning to FIG. 5, the translated main receive signal and the translated diversity receive signal provided by the main and diversity frequency translation circuitries 32 and 38 are then combined with combining circuitry 40 and presented to the duplexer 26. The duplexer 26 will then transmit the composite signal to the base housing electronics 18.

The composite signal will be received by a duplexer 40 and provided to separation circuitry 42, which will effectively separate the translated main receive signal and the translated diversity receive signal and provide them to main frequency translation circuitry 44 and diversity frequency translation circuitry 46, respectively. The translated main and diversity receive signals will be shifted back to being centered about the first center frequency $f_{C1}$, which was originally used for transmitting the main and diversity receive signals from the remote device. Accordingly, the main and diversity receive signals are recovered by the main and diversity frequency translation circuitries 44 and 46 and provided to transceiver circuitry 48, wherein the receive signals are processed in traditional fashion and forwarded to a mobile switching center (MSC) or other device via an MSC interface 50.

For transmitted signals, the base housing electronics 18 will generate a main transmit signal (MAIN TX) using the transceiver circuitry 48 and provide the main transmit signal to a power amplifier (PA) 52. The amplified main transmit signal will then be transmitted to the duplexer 40, which will send the amplifier main transmit signal over the feeder cable 24 toward the masthead electronics 20, which will route the main transmit signal to the main antenna 22M as described above.

The previous embodiment is configured to minimize the impact on the existing transceiver circuitry 48 in the base housing electronics 18. In an alternative embodiment, the translated main and diversity receive signals may be presented directly to the transceiver circuitry 48, which may be modified to be able to process the signals directly, instead of requiring them to be translated back to being centered about their original center frequency, $f_{C1}$. Further, the receive signals that are translated may be shifted up or down in frequency to varying degrees. For example, the receive signals may be shifted down to an intermediate frequency, to a very low intermediate frequency, or to a near DC frequency, such as that used in Zero IF architectures.

Although not shown, power may be fed from the base housing electronics 18 to the masthead Electronics 20 via the antenna feeder. Power would be coupled to the feeder cable 24 and off of the feeder cable 24 using a conventional Bias-T as is typically done for masthead electronics 20. Furthermore, a communication link between the base housing electronics 18 and masthead electronics 20 may also be desirable and implemented. The communication link could be implemented at baseband or at an RF frequency other than those frequencies of interest to the wireless operator, using a low power RF transceiver.

If it is desirable to control the frequency translation to a high level of precision, a local oscillator (LO) signal in the form of a sine wave could be fed up the feeder cable 24 from the base housing electronics 18 and be extracted by the masthead electronics 20. The LO signal could be a sine wave in the range of 100 to 200 MHz to facilitate separation from the RX and TX signals.

Redundancy is often an issue for the masthead electronics 20. It is therefore desirable that a minimum amount of functionality be maintained in the event of a hardware failure with either the LNAs or frequency translation circuitry. It would therefore be advantageous in both the main and diversity receive paths be equipped with frequency translation circuitry. If one frequency translation circuit 32 should fail, the main signal would pass through the redundant circuitry unshifted and remain at its original frequency. In such an event the main receive signal could propagate downwards to the base housing electronics 18 at its original RF frequency and the diversity receive signal would continue to be propagated as described.

Figure 7:
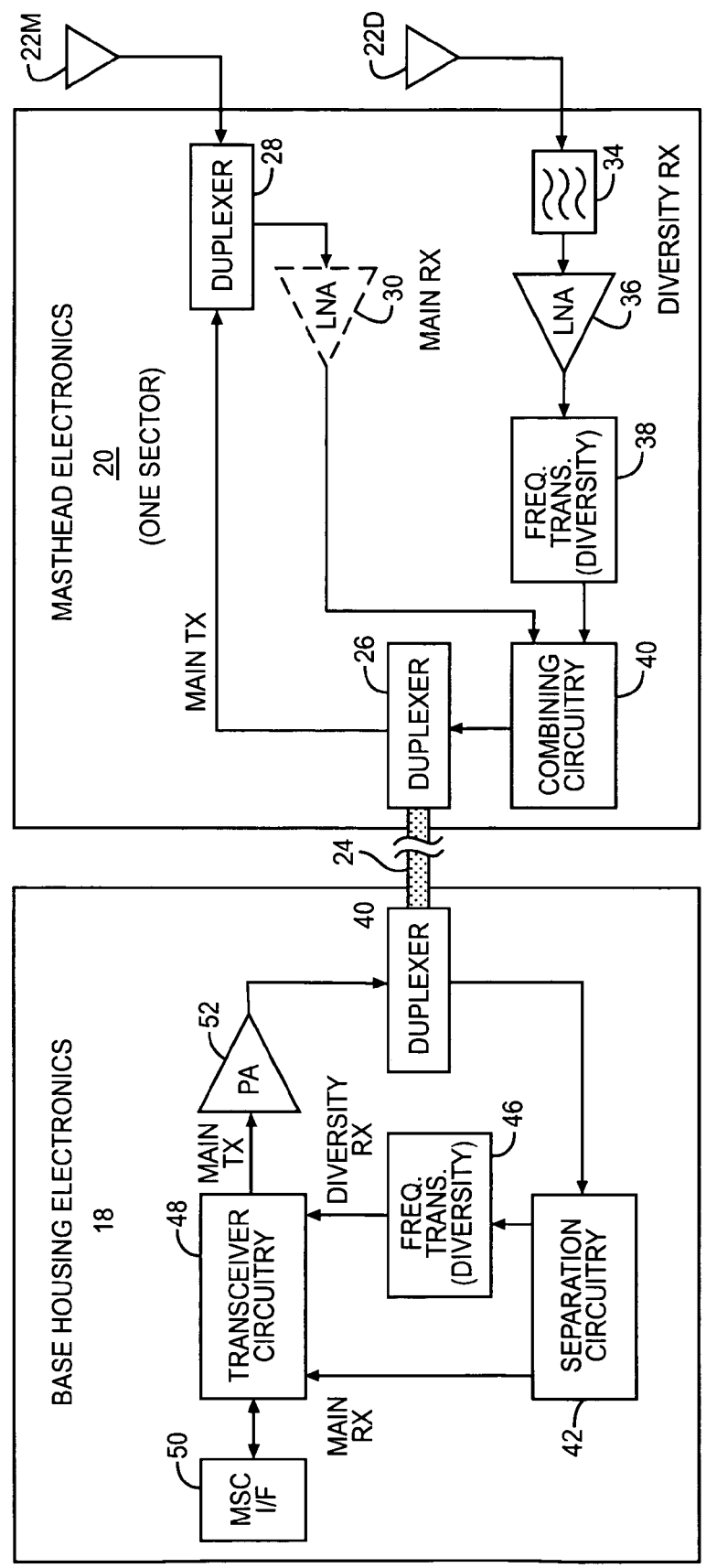
FIG. 7 is a block representation of base housing electronics and masthead electronics according to a second embodiment of a cabling reduction system.

Turning now to FIG. 7, a second embodiment of the cabling reduction system is illustrated. In this embodiment, the main receive signal is not translated, while the diversity receive signal is translated. Thus, the main receive signal and a translated diversity receive signal are combined in the masthead electronics 20 and sent over the feeder cable 24 to the base housing electronics 18. In particular, the main receive signal is received at main antenna 22M, and forwarded to combining circuitry 40 via the duplexer 28, and through an LNA 30. The diversity receive signal is received at diversity antenna 22D, filtered by the filter 34, amplified by the LNA 36, and translated from the first center frequency $f_{C1}$ to a second center frequency $f_{C2}$ by the diversity frequency translation circuitry 38. The main receive signal and the translated diversity receive signal are combined by combining circuitry 40 and sent to duplexer 26 for delivery to the base housing electronics 18 over the feeder cable 24. Upon receipt, the duplexer 40 at the base housing electronics 18 will send a composite receive signal to the separation circuitry 42, which will provide the main receive signal to the transceiver circuitry 48, and the translated diversity receive signal to the diversity frequency translation circuitry 46, which will translate the translated diversity receive signal back to being centered about center frequency $f_{C1}$ to effectively recover the diversity receive signal, which is then provided to the transceiver circuitry 48 for processing. The main transmit signal is transmitted from the main antenna 22M as described in association with FIG. 5.

Figure 8:
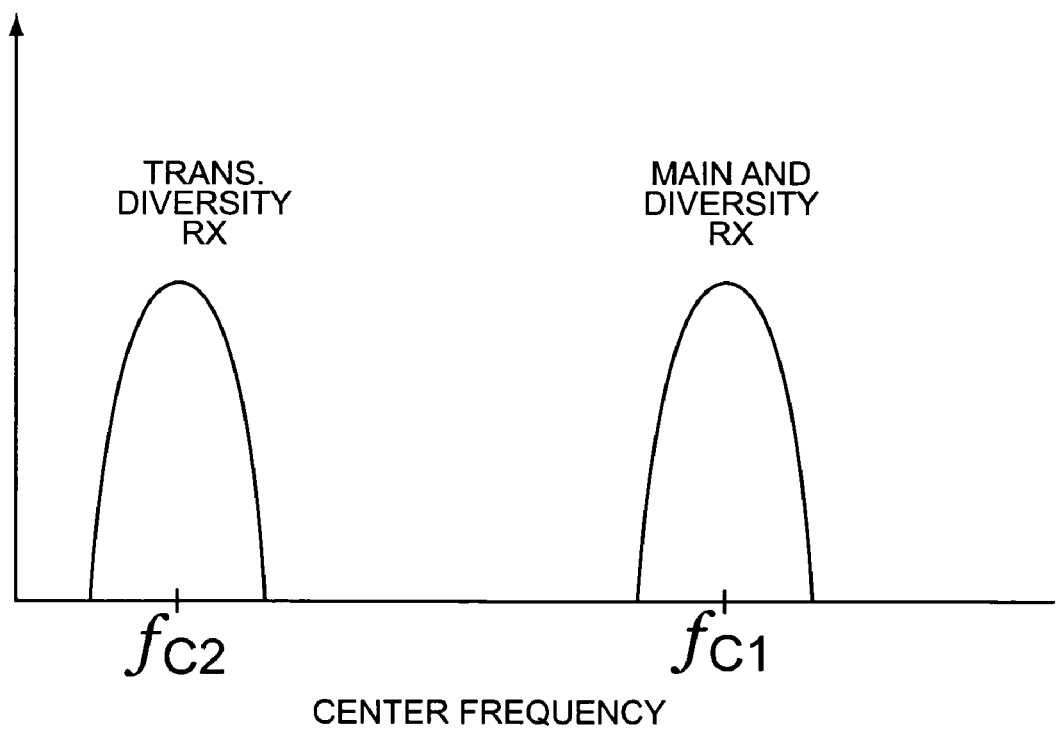
FIG. 8 is a graphical illustration of a frequency translation process according to the embodiment of FIG. 7.

With reference to FIG. 8, a graphical illustration of the translation of the diversity receive signal is shown, as processed in the embodiment of FIG. 7. As illustrated, the translated diversity receive signal is shifted to be centered about center frequency $f_{C2}$, wherein both the main and the original diversity receive signals are centered about center frequency $f_{C1}$.

If a masthead LNA is not desired or needed for the main receive signal, the invention can be further simplified by removing the LNA 30, duplexer 26, and combining circuitry 40. In such a case, both the transmit and main receive signals can be fed directly to the duplexer 26, where they will be combined with a translated diversity receive signal. The duplexer 26 would be designed such that the main filter encompass both the main transmit and main receive frequencies, and the other filter would encompass a shifted diversity receive frequency. This implementation would provide a simpler and less costly module while minimizing transmit path loss.

The advantages of this embodiment are twofold. Firstly, the main receive path can be composed of only passive components, thereby improving reliability. Alternatively, if an LNA 30 is desired at the masthead 16 for both the main and diversity receive signals, this embodiment remains simpler since only the diversity receive frequency needs to be translated at the masthead 16, simplifying the electronics and frequency plan.

Figure 9:
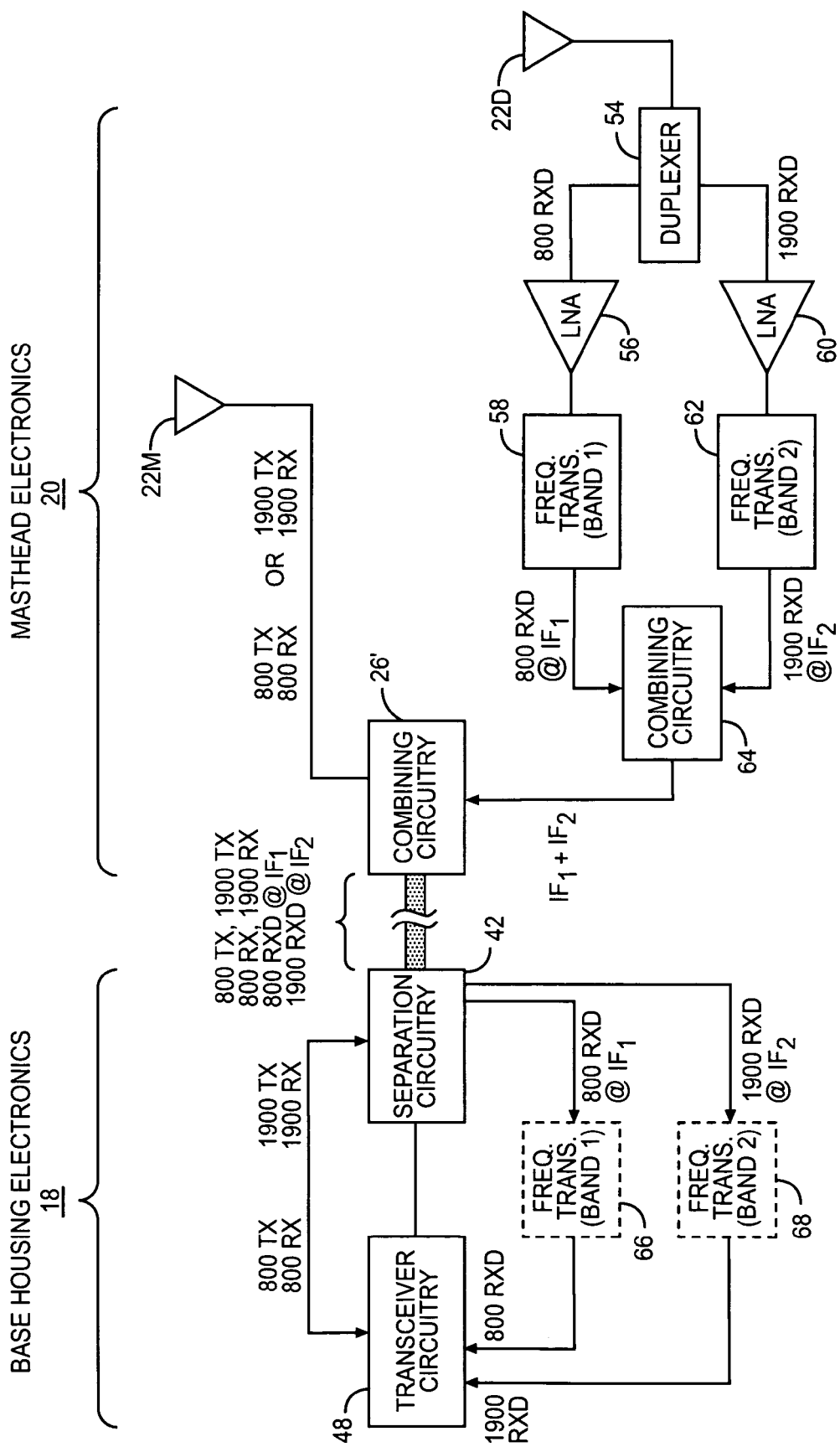
FIG. 9 is a block representation of base housing electronics and masthead electronics according to a third embodiment of a cabling reduction system.

Turning now to FIG. 9, a multi-band implementation of the cabling reduction system is illustrated. A multi-band communication environment is one in which the same or different cellular communication techniques are supported by a base station environment. As illustrated, a single base housing 12 is used, but different base housings 12 may be used for the different frequency bands. In many instances, the different modes of communication, whether incorporating the same or different underlying communication technologies, are centered about different center frequencies. Two common frequencies about which cellular communications are centered are 800 MHz and 1900 MHz. Accordingly, the base station environment must be able to transmit and receive signals at both 800 MHz and 1900 MHz, and may require diversity antennas 22D to assist in receiving signals. In operation, received signals in the 800 or 1900 MHz bands (BAND 1 and BAND 2, respectively) may be received at diversity antenna 22D, wherein a duplexer 54 will send 800 MHz receive signals (800 RXD) through LNA 56 to BAND 1 frequency translation circuitry 58, which will translate the 800 MHz receive signal about a different center frequency. In this example, assume the BAND 1 frequency translation circuitry downconverts the 800 MHz receive signal to a first intermediate frequency ($IF_1$), wherein the downconverted signal is generally referred to as 800 RXD@$IF_1$. Similarly, 1900 MHz receive signals (1900 RXD) will be provided through LNA 60 to BAND 2 frequency translation circuitry 62, which will downconvert the 1900 MHz receive signal to a second intermediate frequency ($IF_2$), wherein the downconverted signal is represented as 1900 RXD @ $IF_2$.

The 800 RXD @ $IF_1$ and 1900 RXD@$IF_2$ signals are combined using combining circuitry 64 to form a composite signal $IF_1+IF_2$, which is provided to combining circuitry 26', which will combine the composite signal $IF_1+IF_2$ with any signals received at the main antenna 22M, and in particular, 800 MHz and 1900 MHz receive signals (800 RX and 1900 RX). Thus, the combining circuitry 26' may combine the 800 and 1900 MHz receive signals with the composite $IF_1+IF_2$ signal and present them over the feeder cable 24 to separation circuitry 42 provided in the base housing electronics 18. The separation circuitry 42 will provide the 800 and 1900 MHz signals to the transceiver circuitry 48, as well as send the 800 RXD @ $IF_1$ and 1900 RXD @ $IF_2$ (translated) signals to respective BAND 1 and BAND 2 frequency translation circuitry 66 and 68. The BAND 1 frequency translation circuitry 66 may upconvert the 800 RXD @ $IF_1$ signal to recover the original 800 RXD signal, and the BAND 2 frequency translation circuitry 68 will process the 1900 RXD @ $IF_2$ signal to recover the original 1900 RXD signal. The 800 RXD and 1900 RXD signals are then provided to the transceiver circuitry 48 for processing in traditional fashion. As noted for the previous embodiment, the transceiver circuitry 48 may be modified to process the downconverted or otherwise translated signals without requiring retranslations back to the original center frequencies, as provided by the BAND 1 and BAND 2 frequency translation circuitry 66 and 68.

Accordingly, the system provides for translating signals from one or more antennas 22 in a base station environment in a manner allowing the translated signals to be combined with one another and other untranslated signals for transmission over a common antenna feeder 24. The present invention is applicable to single and multi-band communication environments, and is not limited to communication technologies or particular operating frequencies. In general, the translation of received signals need only operate such that when the signals are combined with other signals, there is no interference or the interference is otherwise minimal or manageable. Further, the receive signals may be from any spatially diverse array of antennas for one or more sectors. As noted, two base housings 12 that operate in different bands may share the same feeder cables 24 and masthead 16.

Redundancy is a key issue for masthead electronics 20. Active components which are used in the LNA 30 and frequency translation circuitry 32, 38 are less reliable than passive components used to implement the duplexers 26, combining circuitry 40, and filters 34. As such, it may be necessary to bypass the LNAs 30 within the module. An LNA bypass is standard practice for masthead LNAs 30.

More important is redundancy in the frequency translation circuitry 32, 38. Since the objective is to transmit two receive signals, main and diversity, down the same antenna feeder 24 to the base housing electronics 18, loss of the frequency translation function means that only one of the receive signals can be relayed to the base housing electronics 18. It is therefore important to consider redundancy schemes in practice.

One approach is to simply include multiple levels of redundancy within each circuit block. A more sophisticated scheme would be to further use frequency translation circuitry on both the main receive and diversity receive signals as shown in FIG. 5. However, the frequency translation circuitry 32, 38 should be designed as to allow a signal to pass through with relatively little attenuation in the event of a hardware failure. Such would be the case with a serrodyne implemented using exclusively shunt or reflection type switches. The combining circuitry 40 could be designed to accept a signal at the translated receive frequency or original receive frequency on either port. The frequency translation circuitry 32, 38 would only be used in one branch at any given time, and in the other branch the signal would be passed through the frequency translation circuitry with little or no effect. In the event that the active frequency translation circuitry 32, 38 should fail, the unused frequency translation circuitry 32, 38 could be turned on to implement the frequency translation on this branch, and the failed frequency translation circuitry 32, 38 would then allow the signal to pass through untranslated.

Finally, in cases where four-branch receive diversity is used, it is conceivable that each sector contain one transmit signal and four receive signals. In such a case the system could easily be expanded to translate the frequency of all receive signals or alternately on the three diversity receive signals to separate frequencies and combine them all onto one feeder cable 24, where they would be separated by another circuit at the base station housing 12.

Those skilled in the art will recognize improvements and modifications to the preferred embodiments of the present invention. All such improvements and modifications are considered within the scope of the concepts disclosed herein and the claims that follow.

What is claimed is:

1. A system comprising:
   a) a coupler comprising an input port, an output port, and a reflective port;
   b) a delay line coupled to the reflective port and having an electrical length; and
   c) a switching system coupled to the delay line at n nodes and adapted to selectively shunt the n nodes of the delay line to change an effective electrical length of the delay line over a period of a translation frequency such that an input signal received at the input port is shifted in frequency by the translation frequency to provide an output signal at the output port.

2. The system of claim 1 wherein the effective electrical length is increased throughout the period such that a frequency of the output signal is less than a frequency of the input signal by the translation frequency.

3. The system of claim 1 wherein the effective electrical length is decreased throughout the period such that a frequency of the output signal is greater than a frequency of the input signal by the translation frequency.

4. The system of claim 1 wherein the effective electrical length assumes n+1 different values throughout the period.

5. The system of claim 1 wherein the switching system is further adapted to iteratively change the effective electrical length over the period.

6. The system of claim 1 wherein the switching system comprises n switching elements coupled to the n nodes and a control system adapted to selectively activate the switching elements to change the effective electrical length in a manner such that when a plurality of the switching elements switch from an inactive to an active mode, those of the plurality of switching elements associated with a longer electrical length are switched prior to the switching element with the shortest electrical length.

7. The system of claim 1 wherein the switching system comprises n switching elements coupled to the n nodes and a control system adapted to selectively activate the switching elements to change the effective electrical length in a manner such that when a plurality of the switching elements switch from an active to an inactive mode, those of the plurality of switching elements associated with a longer electrical length are switched prior to the switching element with the shortest electrical length.

8. The system of claim 1 wherein the coupler is a circulator.

9. The system of claim 1 wherein the coupler is a hybrid coupler further comprising a second reflective port coupled to a second delay line and the switching system is also coupled to the second delay line at n nodes and adapted to selectively shunt the n nodes of the second delay line to change an effective electrical length of the second delay line over the period of the translation frequency such that the input signal received at the input port is shifted in frequency by the translation frequency to provide the output signal at the output port.

10. The system of claim 1 wherein the switching system comprises a plurality of transistors to selectively shunt the n nodes.

11. The system of claim 1 wherein the n nodes are selectively shunted to ground.

12. Base station electronics for reducing a number of feeder cables between a masthead and a base housing in a base station environment, the base station electronics comprising in the masthead:
   a) a first input adapted to receive a first receive signal centered about a first center frequency from a first antenna;
   b) a second input adapted to receive a second receive signal centered about the first center frequency from a second antenna;
   c) first translation circuitry adapted to translate the first receive signal from the first antenna to being centered about a second center frequency, the first translation circuitry comprising;
      i) a coupler comprising an input port, an output port, and a reflective port;
      ii) a delay line coupled to the reflective port and having an electrical length; and
      iii) a switching system coupled to the delay line at n nodes and adapted to selectively shunt the n nodes of the delay line to change an effective electrical length of the delay line over a period of a translation frequency such that the second receive signal received at the input port is shifted in frequency by the translation frequency to being centered about the second center frequency at the output port; and
   d) combining circuitry adapted to combine the first receive signal centered about the second center frequency and the second receive signal to form a composite signal, which is sent to the base housing electronics over one feeder cable.

13. The base station electronics of claim 12 wherein the first receive signal centered about the second center frequency is combined with the second receive signal centered about the first center frequency to form the composite signal.

14. The base station electronics of claim 13 wherein the first center frequency and the second center frequency are sufficiently spread to minimize interference between the first and second receive signals in the composite signal.

15. The base station electronics of claim 12 further comprising second translation circuitry adapted to translate the second receive signal from the second antenna to being centered about a third center frequency, wherein the first receive signal centered about the second center frequency is combined with the second receive signal centered about the third center frequency to form the composite signal, the second translation circuitry comprising:
  a) a second coupler comprising a second input port, a second output port, and a second reflective port;
  b) a second delay line coupled to the second reflective port; and
  c) a second switching system coupled to the second delay line at n nodes and adapted to selectively shunt the n nodes of the second delay line to change an effective electrical length of the second delay line over a second period of a second translation frequency such that the second receive signal received at the input port is shifted in frequency by the second translation frequency to being centered about the third center frequency at the second output port.

16. The base station electronics of claim 15 wherein the second center frequency and the third center frequency are sufficiently spread to minimize interference between the first and second receive signals in the composite signal.

17. The base station electronics of claim 12 wherein the second antenna is a main antenna also used to transmit signals centered about the first center frequency and the first antenna is a diversity antenna associated with the second antenna, the base station electronics further comprising circuitry adapted to transmit a transmit signal via the main antenna.

18. The base station electronics of claim 12 wherein a plurality of receive signals, including the second receive signal, are received and translated to being centered about different center frequencies and combined to form the composite signal.

19. The base station electronics of claim 12 further comprising in the base housing:
  a) transceiver circuitry; and
  b) separation circuitry adapted to separate the first and second receive signals from the composite signal in the base station electronics, wherein the first and second receive signals are provided to the transceiver circuitry.

20. The base station electronics of claim 19 further comprising, in the base housing, second translation circuitry adapted to translate the first receive signal to being centered about the first center frequency prior to providing the first receive signal to the transceiver circuitry.

21. The base station electronics of claim 20 wherein the second receive signal is translated to a third center frequency before being combined with the first center frequency to form the composite signal, and further comprising third translation circuitry adapted to translate the second receive signal to being centered about the first center frequency prior to providing the second receive signal to the transceiver circuitry.

22. The base station electronics of claim 12 wherein the first and second receive signals correspond to a cellular signal transmitted from a cellular communication device.

23. The base station electronics of claim 12 wherein the first and second antennas are associated with one of a plurality of sectors for the base station environment.

24. The base station electronics of claim 23 wherein each sector uses one antennas feeder cable between electronics in the masthead and electronics in the base housing.

25. The base station electronics of claim 12 wherein the first center frequency is associated with a first cellular band and a fourth center frequency is associated with a second cellular band; a third receive signal centered about the third center frequency is received via the first input from the first antenna; a fourth receive signal centered about the third center frequency is received via the second input from the second antenna, the base station electronics in the masthead further comprising second translation circuitry adapted to translate the third receive signal from the first antenna to being centered about a fourth center frequency, the combining circuitry further adapted to combine the third receive signal centered about the third center frequency and the second receive signal to form at least part of the composite signal, which is sent to the base housing electronics over the feeder cable.

26. The base station electronics of claim 25 further comprising third translation circuitry adapted to translate the fourth receive signal from the second antenna to being centered about a fourth center frequency, wherein the third receive signal centered about the fourth center frequency is combined with the fourth receive signal centered about the fourth center frequency to form at least part of the composite signal.

27. The base station electronics of claim 12 wherein the effective electrical length is increased throughout the period such that a frequency of the output signal is less than a frequency of the input signal by the translation frequency.

28. The base station electronics of claim 12 wherein the effective electrical length is decreased throughout the period such that a frequency of the output signal is greater than a frequency of the input signal by the translation frequency.

29. The base station electronics of claim 12 wherein the effective electrical length assumes n+1 different values throughout the period.

30. The base station electronics of claim 12 wherein the switching system is further adapted to iteratively change the effective electrical length over the period.

31. The base station electronics of claim 12 wherein the switching system comprises n switching elements coupled to the n nodes and a control system adapted to selectively activate the switching elements to change the effective electrical length in a manner such that when a plurality of the switching elements switch from an inactive to an active mode, those of the plurality of switching elements associated with a longer electrical length are switched prior to the switching element with the shortest electrical length.

32. The base station electronics of claim 12 wherein the switching system comprises n switching elements coupled to the n nodes and a control system adapted to selectively activate the switching elements to change the effective electrical length in a manner such that when a plurality of the switching elements switch from an active to an inactive mode, those of the plurality of switching elements associated with a longer electrical length are switched prior to the switching element with the shortest electrical length.

33. The base station electronics of claim 12 wherein the coupler is a circulator.

34. The base station electronics of claim 12 wherein the coupler is a hybrid coupler further comprising a second reflective port coupled to a second delay line and the switching system is also coupled to the second delay line at n nodes and adapted to selectively shunt the n nodes of the second delay line to change an effective electrical length of the second delay line over the period of the translation frequency such that the input signal received at the input port is shifted in frequency by the translation frequency to provide the output signal at the output port.

35. The base station electronics of claim 12 wherein the switching system comprises a plurality of transistors to selectively shunt the n nodes.

36. The base station electronics of claim 12 wherein the n nodes are selectively shunted to ground.

* * * * *